(12) United States Patent
Hashemi et al.

(10) Patent No.: US 10,790,357 B2
(45) Date of Patent: Sep. 29, 2020

(54) VFET WITH CHANNEL PROFILE CONTROL USING SELECTIVE GE OXIDATION AND DRIVE-OUT

(71) Applicant: International Business Machines Corporation, Armonk, NY (US)

(72) Inventors: Pouya Hashemi, Purchase, NY (US); Takashi Ando, Tuckahoe, NY (US); Alexander Reznicek, Troy, NY (US); Jingyun Zhang, Albany, NY (US); Choonghyun Lee, Rensselaer, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/269,220

(22) Filed: Feb. 6, 2019

(65) Prior Publication Data

US 2020/0251558 A1 Aug. 6, 2020

(51) Int. Cl.
*H01L 29/66* (2006.01)
*H01L 29/10* (2006.01)
(Continued)

(52) U.S. Cl.
CPC ........ *H01L 29/1037* (2013.01); *H01L 27/092* (2013.01); *H01L 29/42356* (2013.01); *H01L 29/66666* (2013.01); *H01L 29/7827* (2013.01)

(58) Field of Classification Search
None
See application file for complete search history.

(56) References Cited

U.S. PATENT DOCUMENTS

| 6,642,575 B1 * | 11/2003 | Ono ................ H01L 21/823828 257/302 |
| 6,903,411 B1 * | 6/2005 | Chyan ............... H01L 21/76895 257/327 |

(Continued)

OTHER PUBLICATIONS

Narasimhulu, K., et al., "Impact of lateral asymmetric channel doping on deep submicrometer mixedsignal device and circuit performance", IEEE Transactions on Electron Devices, Dec. 2003, pp. 2481-2489, vol. 50, No. 12.

(Continued)

*Primary Examiner* — Bilkis Jahan
(74) *Attorney, Agent, or Firm* — Scully, Scott, Murphy & Presser, P.C.; L. Jeffrey Kelly, Esq.

(57) ABSTRACT

Vertical field effect transistors (VFETs) having a gradient threshold voltage and an engineered channel are provided. The engineered channel includes a vertical dog-bone shaped channel structure that is composed of silicon having a germanium content that is 1 atomic percent or less and having a lower portion having a first channel width, a middle portion having a second channel width that is less than the first channel width, and an upper portion having the first channel width. Due to the quantum confinement effect, the middle portion of the vertical dog-bone shaped channel structure has a higher threshold voltage than the lower portion and the upper portion of the vertical dog-bone shaped channel structure. Hence, the at least one vertical dog-bone shaped channel structure has an asymmetric threshold voltage profile. Also, the VFET containing the vertical dog-bone shaped channel structure has improved electrical characteristics and device performance.

8 Claims, 12 Drawing Sheets

(51) Int. Cl.
*H01L 29/78* (2006.01)
*H01L 29/423* (2006.01)
*H01L 27/092* (2006.01)

(56) References Cited

U.S. PATENT DOCUMENTS

| | | | |
|---|---|---|---|
| 6,960,806 | B2 | 11/2005 | Bryant et al. |
| 9,929,245 | B2 | 3/2018 | Colinge et al. |
| 9,947,585 | B2 | 4/2018 | Nidhi et al. |
| 2006/0046459 | A1* | 3/2006 | Ramaswamy ...... H01L 21/0262 438/607 |
| 2010/0052055 | A1* | 3/2010 | Takeuchi .............. H01L 27/092 257/351 |
| 2017/0229449 | A1 | 8/2017 | Balakrishnan et al. |
| 2018/0277676 | A1 | 9/2018 | Basker et al. |

OTHER PUBLICATIONS

Baek, K.-J., et al., "Device Optimization of N-Channel MOSFETs with Lateral Asymmetric Channel Doping Profiles", Transactions on Electrical and Electronic Materials, Feb. 25, 2010, pp. 15-19, vol. 11, No. 1.

He, X., et al., "Impact of Aggressive Fin Width Scaling on FinFET Device Characteristics", 2017 IEEE International Electron Devices Meeting (IEDM), Date of Conference: Dec. 2-6, 2017, 4 pages, Conference Location: San Francisco, CA.

Wu, Z., et al., "Quantum Confinement and Electronic Properties of Tapered Silicon Nanowires", Physical Review Letters, Jun. 2008, pp. 246804-1 to 246804-4, 100.

Tsutsui, G., et al., "Impact of SOI Thickness Fluctuation on Threshold Voltage Variation in Ultra-Thin Body SOI MOSFETs", IEEE Transactions on Nanotechnology, May 2005, pp. 369-373, vol. 4, No. 3.

* cited by examiner

VFET WITH CHANNEL PROFILE CONTROL USING SELECTIVE GE OXIDATION AND DRIVE-OUT

BACKGROUND

The present application relates to a semiconductor structure and a method of forming the same. More particularly, the present application relates to a semiconductor structure including at least one vertical field effect transistor (VFET) having a gradient threshold voltage and an engineered channel, and a method of forming such a structure.

Conventional VFETs are devices where the source-drain current flows in a direction normal to the substrate surface. In such devices, a vertical semiconductor fin (or pillar) defines the channel with the source and drain located at opposing ends of the semiconductor fin. VFETs are an attractive option for technology scaling for 5 nm and beyond.

The lateral asymmetric channel (LAC) doping profile approach provides one of the most effective ways to improve the electrical characteristics of transistor devices. For LAC devices, the doping concentration of the source side is higher than that of the drain side in the channel. The channel potential transition at the source side channel region is much stepper than that of the other channel regions while the device is operating due to non-uniform channel doping. Such a steep potential distribution near the source side enhances the lateral channel electric field and this increases the carrier mobility.

The LAC approach, however, suffers from channel dopant diffusion and dopant variation. Also, it is difficult to design short channel devices using the LAC approach. There is thus a need for providing a VFET having improved electrical characteristics and device performance.

SUMMARY

Vertical field effect transistors (VFETs) having a gradient threshold voltage and an engineered channel are provided. The engineered channel includes a vertical dog-bone shaped channel structure that is composed of silicon having a germanium content that is 1 atomic percent or less and having a lower portion having a first channel width, a middle portion having a second channel width that is less than the first channel width, and an upper portion having the first channel width. Due to the quantum confinement effect, the middle portion of the vertical dog-bone shaped channel structure has a higher threshold voltage than the lower portion and the upper portion of the vertical dog-bone shaped channel structure. Hence, the at least one vertical dog-bone shaped channel structure has an asymmetric threshold voltage profile. Also, the VFET containing the vertical dog-bone shaped channel structure has improved electrical characteristics and device performance.

In one aspect of the present application, a semiconductor structure is provided. In one embodiment, the semiconductor structure includes at least one vertical dog-bone shaped channel structure present in a device region and extending upwards from a silicon base substrate. In accordance with the present application, the at least one vertical dog-bone shaped channel structure is composed of silicon having a germanium content that is 1 atomic percent or less and having a lower portion having a first channel width, a middle portion having a second channel width that is less than the first channel width, and an upper portion having the first channel width. A bottom drain region is located beneath the lower portion of the at least one vertical dog-bone shaped channel structure, and a top source region is located on a topmost surface of the upper portion of the at least one vertical dog-bone shaped channel structure. In accordance with the present application, the middle portion of the at least one vertical dog-bone shaped channel structure is in closer proximity to the top source region than the bottom drain region. A gate structure is located laterally adjacent to the at least one vertical dog-bone shaped channel structure.

Due to the quantum confinement effect, the middle portion of the at least one vertical dog-bone shaped channel structure has a higher threshold voltage than the lower portion and the upper portion of the at least one vertical dog-bone shaped channel structure. Hence, the at least one vertical dog-bone shaped channel structure has an asymmetric threshold voltage profile.

In another embodiment, the semiconductor structure a vertical n-type field effect transistor (nFET) and a laterally adjacent p-type field effect transistor (pFET). The vertical nFET comprises includes at least one vertical dog-bone shaped channel structure present in an nFET device region and extending upwards from a silicon base substrate. The at least one vertical dog-bone shaped channel structure present in the nFET device region is composed of silicon having a germanium content that is 1 atomic percent or less and having a lower portion having a first channel width, a middle portion having a second channel width that is less than the first channel width, and an upper portion having the first channel width. A bottom nFET drain region is located beneath the lower portion of the at least one vertical dog-bone shaped channel structure present in the nFET device region. An nFET gate structure is located laterally adjacent to the at least one vertical dog-bone shaped channel structure present in the nFET device region. A top nFET source region is located on a topmost surface of the upper portion of the at least one vertical dog-bone shaped channel structure in the nFET device region. In accordance with the present application, the middle portion of the at least one vertical dog-bone shaped channel structure in the nFET device region is in closer proximity to the top nFET source region than the bottom nFET drain region.

The vertical pFET includes at least one vertical dog-bone shaped channel structure present in a pFET device region and extending upwards from the silicon base substrate. The at least one vertical dog-bone shaped channel structure present in the pFET device region is composed of silicon having a germanium content that is 1 atomic percent or less and having a lower portion having a first channel width, a middle portion having a second channel width that is less than the first channel width, and an upper portion having the first channel width. A bottom pFET drain region is located beneath the lower portion of the at least one vertical dog-bone shaped channel structure present in the pFET device region. A pFET gate structure is located laterally adjacent to the at least one vertical dog-bone shaped channel structure present in the pFET device region. A top pFET source region is located on a topmost surface of the upper portion of the at least one vertical dog-bone shaped channel structure in the pFET device region. In accordance with the present application, the middle portion of the at least one vertical dog-bone shaped channel structure in the pFET device region is in closer proximity to the top pFET source region than the bottom pFET drain region.

Due to the quantum confinement effect, the middle portion of the at least one vertical dog-bone shaped channel structure that is present in both the nFET device region and the pFET device region has a higher threshold voltage than the lower portion and the upper portion of the at least one vertical dog-bone shaped channel structure. Hence, the at least one vertical dog-bone shaped channel structure present in both the nFET device region and the pFET device region has an asymmetric threshold voltage profile.

In another aspect of the present application, a method of forming a semiconductor structure is provided. In one embodiment, the method includes forming at least one vertical dog-bone shaped channel structure in a device region and extending upwards from a silicon base substrate. The at least one vertical dog-bone shaped channel structure is composed of silicon having a germanium content that is 1 atomic percent or less and having a lower portion having a first channel width, a middle portion having a second channel width that is less than the first channel width, and an upper portion having the first channel width. Next, a bottom drain region is formed beneath the lower portion of the at least one vertical dog-bone shaped channel structure. A gate structure is then formed laterally adjacent to the at least one vertical dog-bone shaped channel structure. Next, a top source region is formed on a topmost surface of the upper portion of the at least one vertical dog-bone shaped channel structure. In accordance with the present application, the middle portion of the at least one vertical dog-bone shaped channel structure is in closer proximity to the top source region than the bottom drain region.

DETAILED DESCRIPTION

Figure 1:
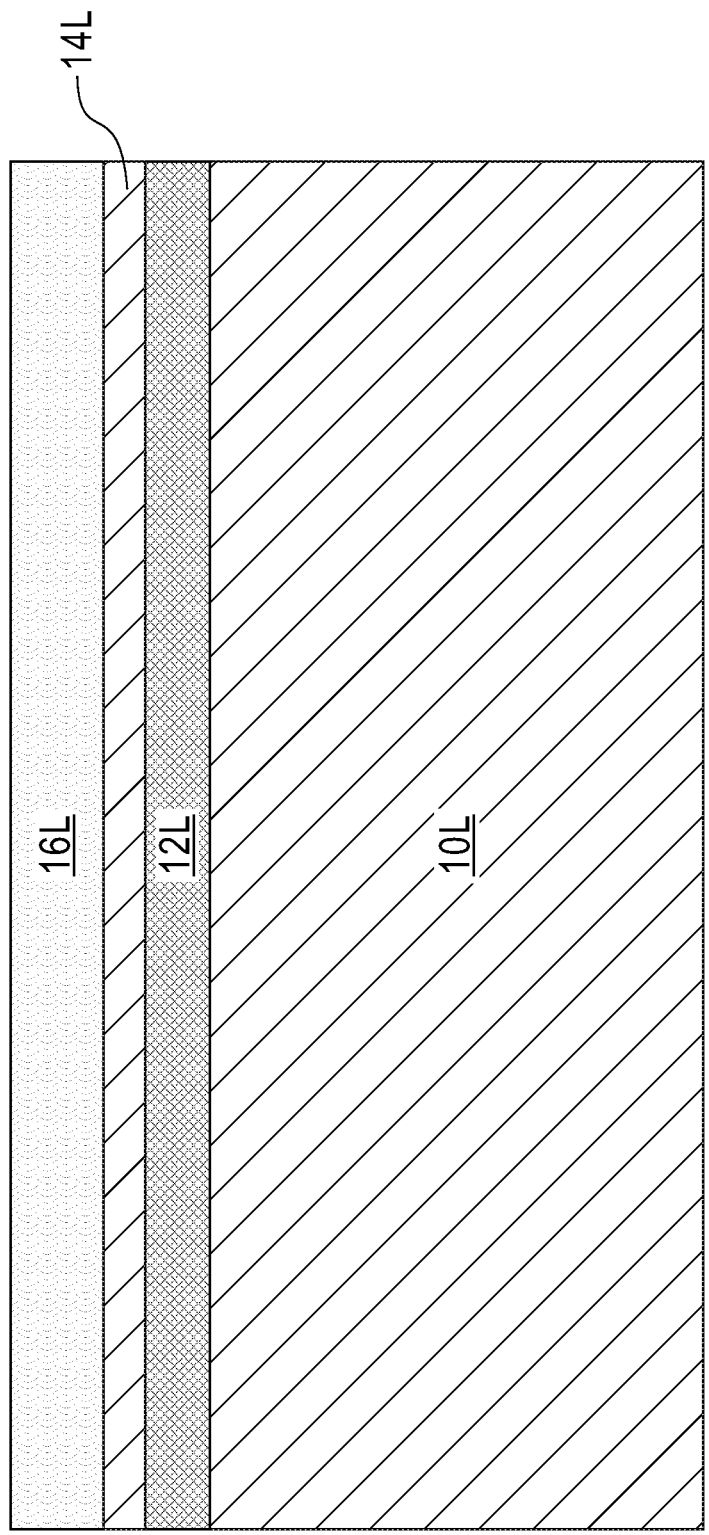
FIG. 1 is a cross sectional view of an exemplary semiconductor structure of the present application during an early stage of fabrication, and including a material stack located on a surface of a silicon substrate, wherein the material stack includes a silicon germanium alloy layer having a first germanium content, an undoped silicon layer, and a hard mask layer.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated an exemplary semiconductor structure of the present application during an early stage of fabrication. As is shown, the exemplary semiconductor structure of FIG. 1 includes a material stack located on a surface of a silicon substrate 10L, wherein the material stack includes a silicon germanium alloy layer 12L having a first germanium content, an undoped silicon layer 14L, and a hard mask layer 16L.

The silicon germanium alloy layer 12L having the first germanium content is a continuous layer that is formed on an entirety of the silicon substrate 10L. The first germanium content of the silicon germanium alloy layer 12L may be from 5 atomic percent germanium to 15 atomic percent germanium; thus the silicon germanium alloy layer 12L may be referred to as a low germanium content silicon germanium alloy layer. In one specific example, the first germanium content of the silicon germanium alloy layer 12L is about 10 atomic percent germanium; the term about denotes that a value may be within ±10 percent of a given value. The silicon germanium alloy layer 12L typically has a thickness from 3 nm to 20 nm.

The silicon germanium alloy layer 12L is formed utilizing an epitaxial growth (or deposition) process. The terms "epitaxially growing and/or depositing" and "epitaxially grown and/or deposited" mean the growth of a second semiconductor material on a deposition surface of a first semiconductor material, in which the second semiconductor material being grown has the same crystalline characteristics as the deposition surface of the first semiconductor material. In an epitaxial growth process, the chemical reactants provided by the source gases are controlled and the system parameters are set so that the depositing atoms arrive at the deposition surface of the first semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. In the present application, the silicon germanium alloy layer 12L has an epitaxial relationship with the physically exposed surface of the silicon-containing substrate 10L.

Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The epitaxial growth may be performed at a temperature of from 300° C. to 950° C. The epitaxial growth of the silicon germanium alloy layer 12L can be performed utilizing any well known precursor gas or gas mixture. Carrier gases like hydrogen, nitrogen, helium and argon can be used.

The undoped silicon layer 14L is formed on a physically exposed surface of the silicon germanium alloy layer 12L. The term "undoped silicon" denotes silicon that contains no n-type dopants or p-type dopants. That is, undoped silicon layer 14L is composed of unalloyed and non-doped silicon. The undoped silicon layer 14L is formed utilizing an epitaxial growth (or deposition) process, as mentioned above, utilizing a silicon-containing precursor gas such as, for example, a silane. Thus, the undoped silicon layer 14L has an epitaxial relationship with the underlying deposition surface of the silicon germanium alloy layer 12L. The undoped silicon layer 14L is a continuous layer (without any breaks or gaps) that typically has a thickness from 10 nm to 50 nm.

The hard mask layer 16L is formed on a physically exposed surface of the undoped silicon layer 14L. The hard mask layer 16L is composed of a dielectric hard mask material such as, for example, silicon dioxide, silicon nitride and/or silicon oxynitride. In one example, silicon nitride is employed as the dielectric hard mask material of hard mask layer 16L.

The hard mask layer 16L can be formed utilizing a deposition process such as, for example, chemical vapor deposition (CVD) or plasma enhanced chemical vapor deposition (PECVD). In some embodiments, the hard mask layer 16L can be formed by a thermal growth process such as, for example, thermal oxidation and/or thermal nitridation. In yet other embodiments, the hard mask layer 16L may be formed utilizing a combination of, and in any order, a deposition process and a thermal growth process. The hard mask layer 16L is a continuous layer (without any breaks or gaps) whose thickness may be from 20 nm to 100 nm. Other thicknesses that are lesser than, or greater than the aforementioned thicknesses values may also be employed as the thickness of the hard mask layer 16L.

Figure 2:
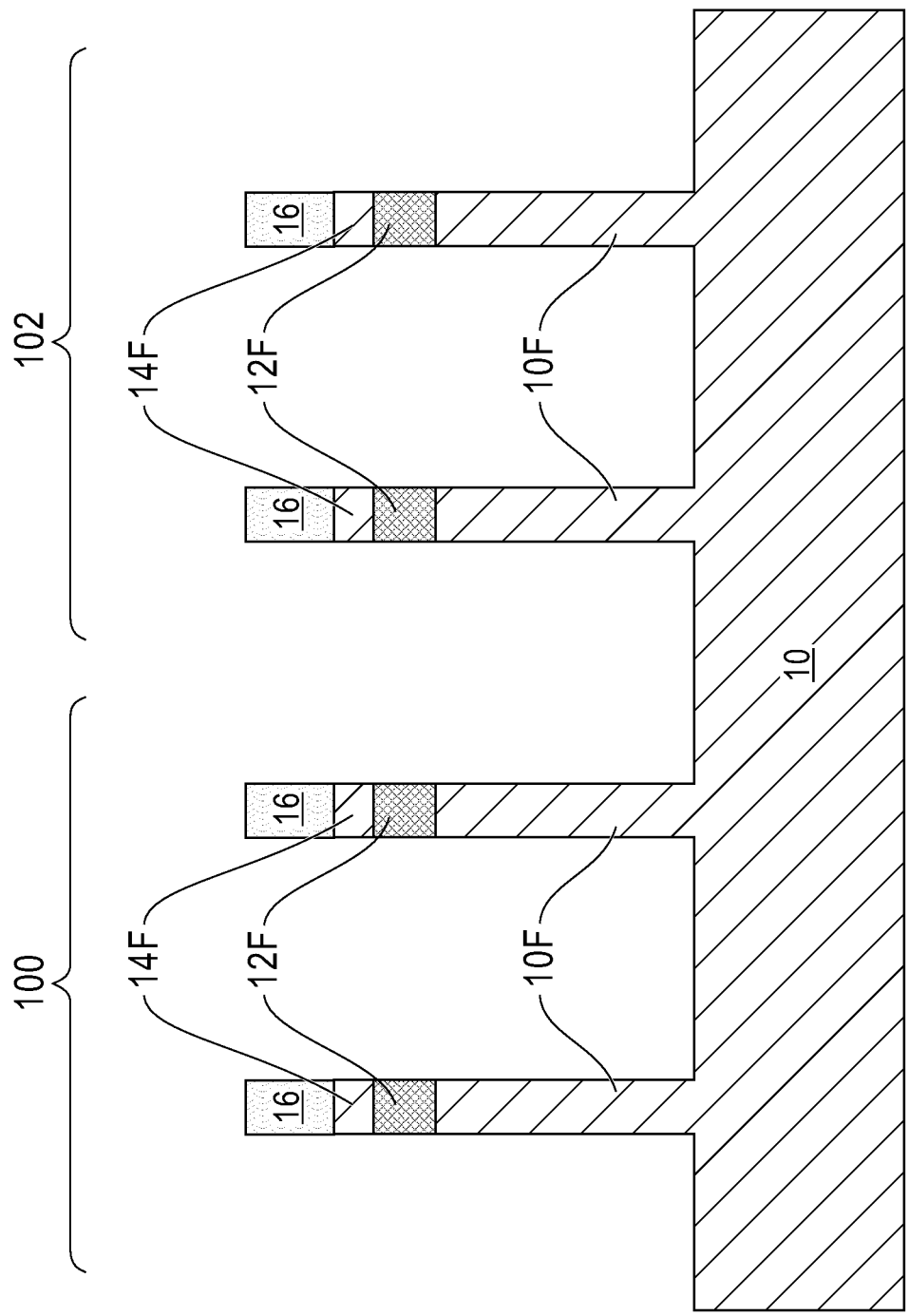
FIG. 2 is a cross sectional view of the exemplary semiconductor structure of FIG. 1 after patterning the material stack and an upper portion of the silicon substrate to provide a plurality of semiconductor material structures extending upwards from a lower portion of the silicon-containing substrate, wherein a first set of the plurality of semiconductor material structures is located in an nFET device region, and a second set of the plurality of semiconductor material structures is present in a pFET device region, and wherein each semiconductor material structure contains a hard mask cap and includes a lower silicon portion, a silicon germanium alloy portion having the first germanium content, and an upper silicon portion.

Referring now to FIG. 2, there is illustrated the exemplary semiconductor structure of FIG. 1 after patterning the material stack and an upper portion of the silicon substrate 10L to provide a plurality of semiconductor material structures (10F/12F/14F) extending upwards from a lower portion of the silicon substrate 10L. The lower portion of the silicon substrate 10L may be referred to herein as a silicon base substrate 10.

As is shown in FIG. 2, a first set of the plurality of semiconductor material structures (10F/12F/14F) is located in an nFET device region 100, and a second set of the plurality of semiconductor material structures (10F/12F/14F) is present in a pFET device region 102. Each semiconductor material structures (10F/12F/14F) contains a hard mask cap 16 and includes a lower silicon portion 10F, a silicon germanium alloy portion 12F having the first germanium content, and an upper silicon portion 14F.

Although the present application illustrates the formation of two semiconductor material structures (10F/12F/14F) in each of the respective device regions (100, 102), the present application is not limited to forming that number of semiconductor material structures (10F/12F/14F) into the respective device regions (100, 102). Instead, the present application can be employed when one or more semiconductor material structures (10F/12F/14F) are formed into a respective device region (100, 102). Also, and although the present application describes and illustrates the presence of an nFET device region 100 and a pFET device region 102, the present application works equally well when one of the device regions is excluded.

In one embodiment, each semiconductor material structures (10F, 12F, 14F) is a semiconductor fin. As used herein, a "semiconductor fin" refers to a semiconductor structure including that includes a pair of vertical sidewalls that are parallel to each other. As used herein, a surface is "vertical" if there exists a vertical plane from which the surface does not deviate by more than three times the root mean square roughness of the surface. In one embodiment, each semiconductor material structure (10F/12F/14F) is a semiconductor fin having a height from 15 nm to 100 nm, a length from 20 nm to 50 nm, and a width from 3 nm to 15 nm. Other semiconductor fin heights and/or widths that are lesser than, or greater than, the ranges mentioned herein can also be used in the present application. Each semiconductor fin is spaced apart from its nearest neighboring semiconductor fin by a pitch of from 20 nm to 100 nm; the pitch is measured from one point of one semiconductor fin to the exact point on a neighboring semiconductor fin. Also, each semiconductor fin is oriented parallel to each other. An opening or gap is present between each neighboring pair of semiconductor fins.

In one embodiment, each semiconductor material structures (10F, 12F, 14F) is a semiconductor pillar. As used herein, a "semiconductor pillar" refers to a semiconductor structure which is similar (in terms of height and width) to a semiconductor fin except that the length of the semiconductor pillar is much less than the length of a semiconductor fin. In one embodiment, the length of the semiconductor pillar is from 3 nm to 15 nm.

In one embodiment, the patterning of the material stack (12L, 14L, 16L) and the upper portion of the silicon substrate 10L may include lithography and etching. The lithographic process includes forming a photoresist (not shown) atop a material or material stack to be patterned, exposing the photoresist to a desired pattern of radiation, and developing the exposed photoresist utilizing a conventional resist developer. The photoresist may be a positive-tone photoresist, a negative-tone photoresist or a hybrid-tone photoresist. The etching process (i.e., pattern transfer etch) includes a dry etching process (such as, for example, reactive ion etching, ion beam etching, plasma etching or laser ablation), and/or a wet chemical etching process. In some embodiments, the patterned photoresist is removed from the structure immediately after the pattern has been transferred into the hard mask layer. In other embodiments, the patterned photoresist is removed from the structure after the pattern has been transferred into both the hard mask layer and the upper semiconductor material portion of the base semiconductor substrate. In either embodiment, the patterned photoresist may be removed utilizing a conventional photoresist stripping process such as, for example, ashing.

In another embodiment, the patterning of the material stack (12L, 14L, 16L) and the upper portion of the silicon substrate 10L may include a sidewall image transfer (SIT) process. The SIT process includes forming a mandrel material layer (not shown) atop the material or material layers that are to be patterned. The mandrel material layer (not shown) can include any material (semiconductor, dielectric or conductive) that can be selectively removed from the structure during a subsequently performed etching process. In one embodiment, the mandrel material layer (not shown) may be composed of amorphous silicon or polysilicon. In another embodiment, the mandrel material layer (not shown) may be composed of a metal such as, for example, Al, W, or Cu. The mandrel material layer (not shown) can be formed, for example, by chemical vapor deposition or plasma enhanced chemical vapor deposition. Following deposition of the mandrel material layer (not shown), the mandrel material layer (not shown) can be patterned by lithography and etching to form a plurality of mandrel structures (also not shown) on the topmost surface of the structure.

The SIT process continues by forming a spacer (not shown) on each sidewall of each mandrel structure. The spacer can be formed by deposition of a spacer material and then etching the deposited spacer material. The spacer material may comprise any material having an etch selectivity that differs from the mandrel material. Examples of deposition processes that can be used in providing the spacer material include, for example, chemical vapor deposition (CVD), plasma enhanced chemical vapor deposition (PECVD), or atomic layer deposition (ALD). Examples of etching that be used in providing the spacers include any etching process such as, for example, reactive ion etching.

After formation of the spacers, the SIT process continues by removing each mandrel structure. Each mandrel structure can be removed by an etching process that is selective for removing the mandrel material. Following the mandrel structure removal, the SIT process continues by transferring the pattern provided by the spacers into the underlying material or material layers. The pattern transfer may be achieved by utilizing at least one etching process. Examples of etching processes that can used to transfer the pattern may include dry etching (i.e., reactive ion etching, plasma etching, and ion beam etching or laser ablation) and/or a chemical wet etch process. In one example, the etch process used to transfer the pattern may include one or more reactive ion etching steps. Upon completion of the pattern transfer, the SIT process concludes by removing the spacers from the structure. Each spacer may be removed by etching or a planarization process.

In yet a further embodiment, the patterning of the material stack (12L, 14L, 16L) and the upper portion of the silicon substrate 10L may include a direct self-assembly (DSA) process in which a copolymer that is capable of direct self-assembly is used.

In any of the embodiments, the patterning of the material stack (12L, 14L, 16L) and the upper portion of the silicon substrate 10L provides a plurality of semiconductor material structures (10F/12F/14F) extending upwards from a lower portion of the silicon substrate 10L, as shown in FIG. 2. As mentioned above, hard mask cap 16 is located on each semiconductor material structure (10F/12F/14F). Each hard mask cap 16 constituents a remaining (i.e., non-etched) portion of the hard mask layer 16L. As also mentioned above, each semiconductor material structure (10F/12F/14F) includes lower silicon portion 10F (i.e., a remaining (non-etched) portion of the upper portion of the silicon substrate 10L), silicon germanium alloy portion 12F (i.e., a remaining (non-etched) portion of the silicon germanium alloy layer 12L), and upper silicon portion 14F (i.e., a remaining (non-etched) portion of the undoped silicon layer 14L). At this point of the present application, the hard mask cap 16, the lower silicon portion 10F, the silicon germanium alloy portion 12F, and the upper silicon portion 14F of each semiconductor have sidewalls that are vertically aligned to each other, i.e., the various material portions of each semiconductor material structure has a same width and length.

Figure 3:
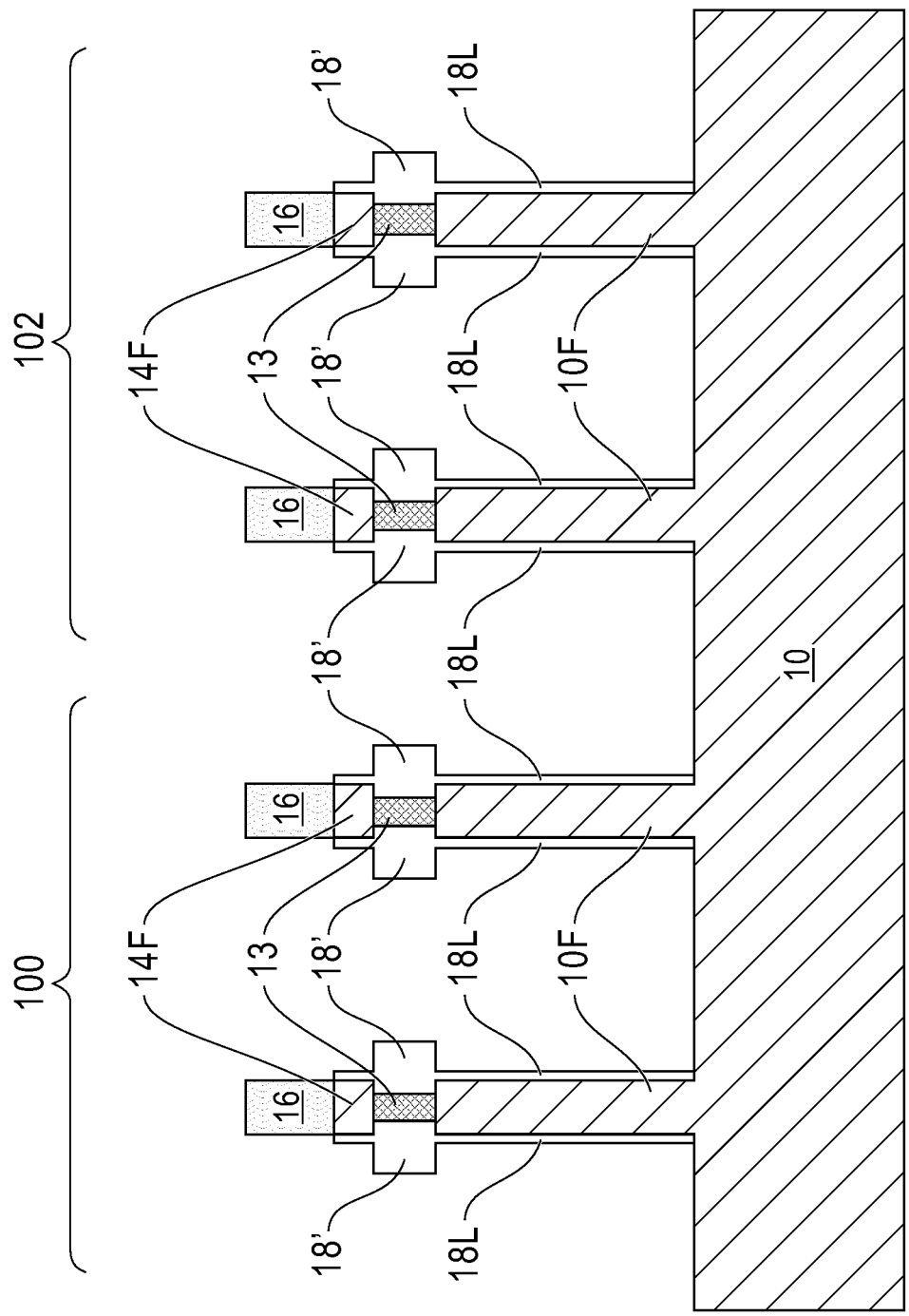
FIG. 3 is a cross sectional view of the exemplary semiconductor structure of FIG. 2 after performing a low temperature oxidation process that oxides silicon germanium faster than silicon.

Referring now to FIG. 3, there is illustrated the exemplary semiconductor structure of FIG. 2 after performing a low temperature oxidation process that oxides silicon germanium faster than silicon. During the low temperature oxidation process, the silicon germanium alloy portion 12F of each semiconductor material structure (10F, 12F, 14F) is consumed at a much faster rate than the silicon portions of the exemplary structure shown in FIG. 2. In some embodiments, the silicon portions of the exemplary structure are not consumed at all.

In addition to the consumption mentioned above, and during the oxidation, a first silicon dioxide layer 18L having a first thickness is typically formed on the physically exposed silicon surfaces of the exemplary structure, while a second silicon dioxide layer 18' having a second thickness that greater than the first thickness forms on a thinned portion of the silicon germanium alloy portion 12F; i.e., thinned silicon germanium alloy portion 13. The first and second silicon dioxide layers are of unitary construction. In some embodiments, the first silicon dioxide layer 18L does not form.

The thinned silicon germanium alloy portion 13 has a higher germanium content than the original silicon germanium alloy portion 12F. In one embodiment, thinned silicon germanium alloy portion 13 has a germanium content from 15 atomic percent to 50 atomic percent. The thinned silicon germanium alloy portion 13 has a width that is less than the width of the lower silicon portion 10F and the upper silicon portion 14F; thinning of the lower silicon portion 10F and the upper silicon portion 14F occurs but it is negligible as compared to the thinning of the silicon germanium alloy portion 12F.

The low temperature oxidation process can be performed at a temperature of 800° C. or less. In one example, the low temperature oxidation process can be performed at a temperature from 500° C. to 800° C. The low temperature oxidation is performed in an oxygen-containing ambient such as, for example, $O_2$ or $N_2/O_2$.

Figure 4:
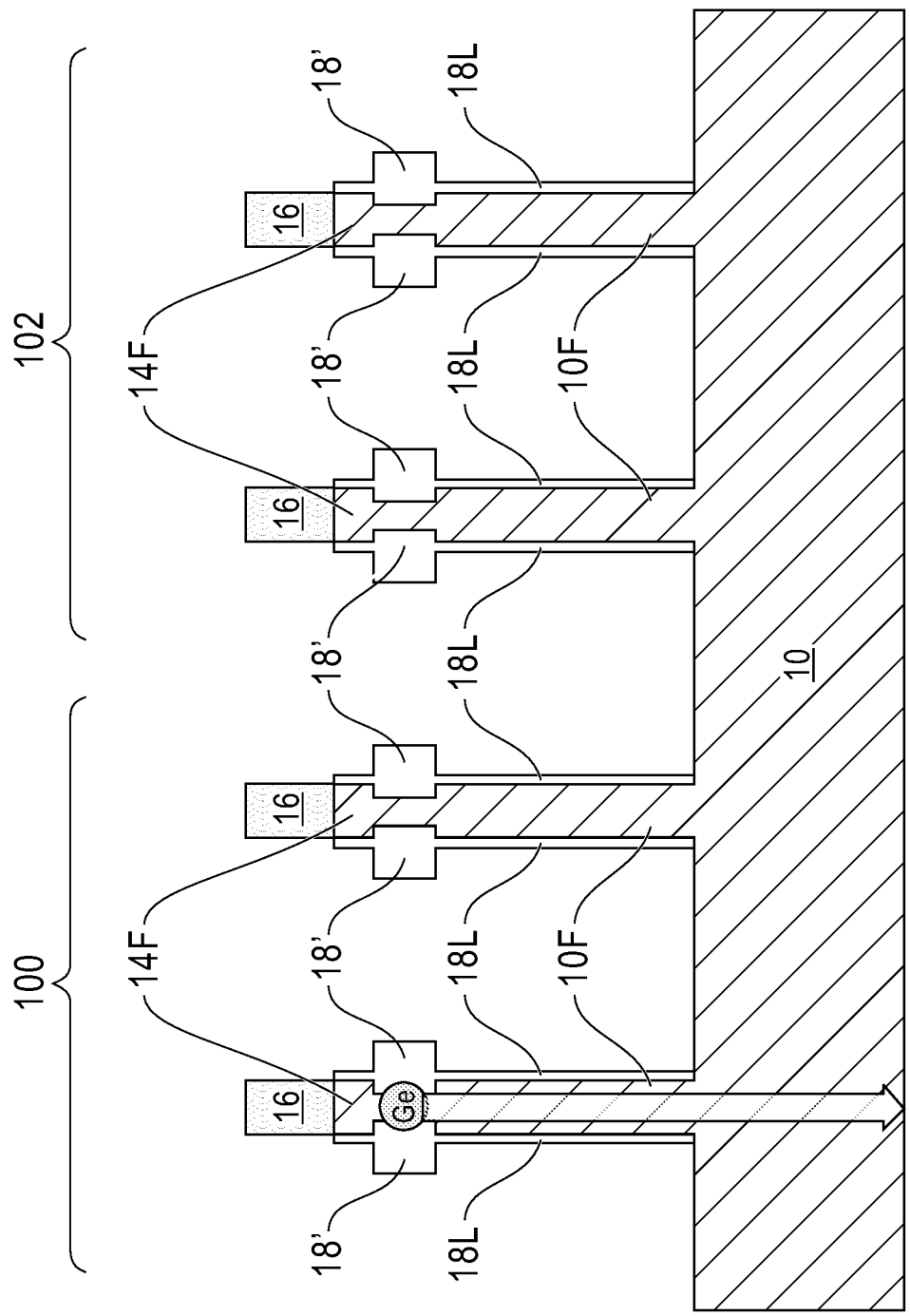
FIG. 4 is a cross sectional view of the exemplary semiconductor structure of FIG. 3 during an initial stage of performing a germanium drive-out anneal.

Referring now to FIG. 4, there is illustrated the exemplary semiconductor structure of FIG. 3 during an initial stage of performing a germanium drive-out anneal. The germanium drive-out anneal causes germanium atoms to diffuse out of the thinned silicon germanium alloy portion 13 into the upper silicon portion 14F and the lower silicon portion 10F of each semiconductor material structure. The germanium atoms may also diffuse out of the thinned silicon alloy portion 13 into the silicon base substrate 10. The arrow shown in FIG. 4 shows only the downward diffusion of germanium atoms out of the thinned silicon germanium alloy portion 13.

Figure 5:
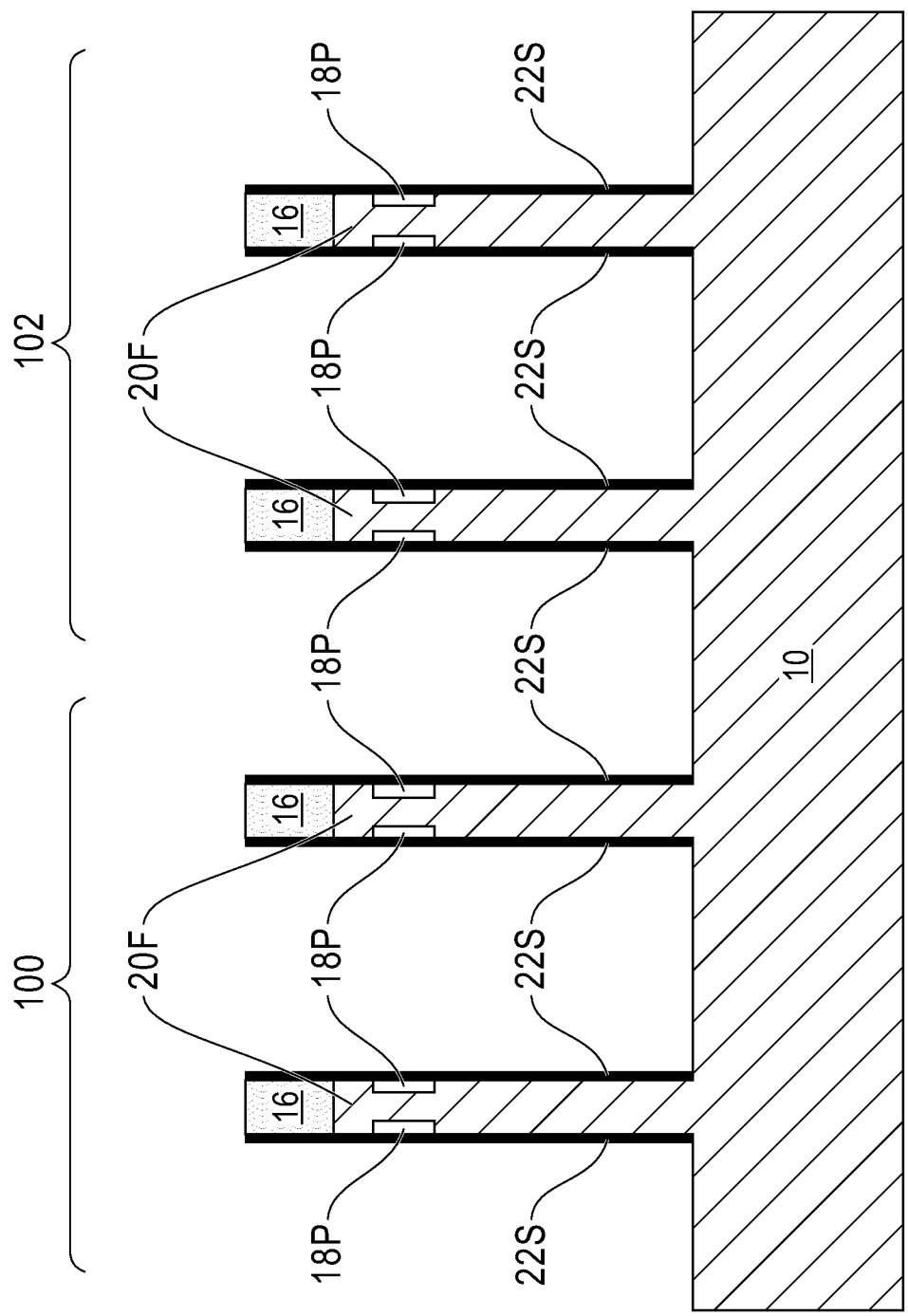
FIG. 5 is a cross sectional view of the exemplary semiconductor structure of FIG. 4 after completing the drive-out anneal to provide a plurality of vertical dog-bone shaped channel structures in each of the device regions, each vertical dog-bone shaped channel structure is composed of a silicon having a second germanium content that is less than the first germanium content, and forming a spacer along a sidewall of each of the vertical dog-bone shaped channel structures.
Figure 6:
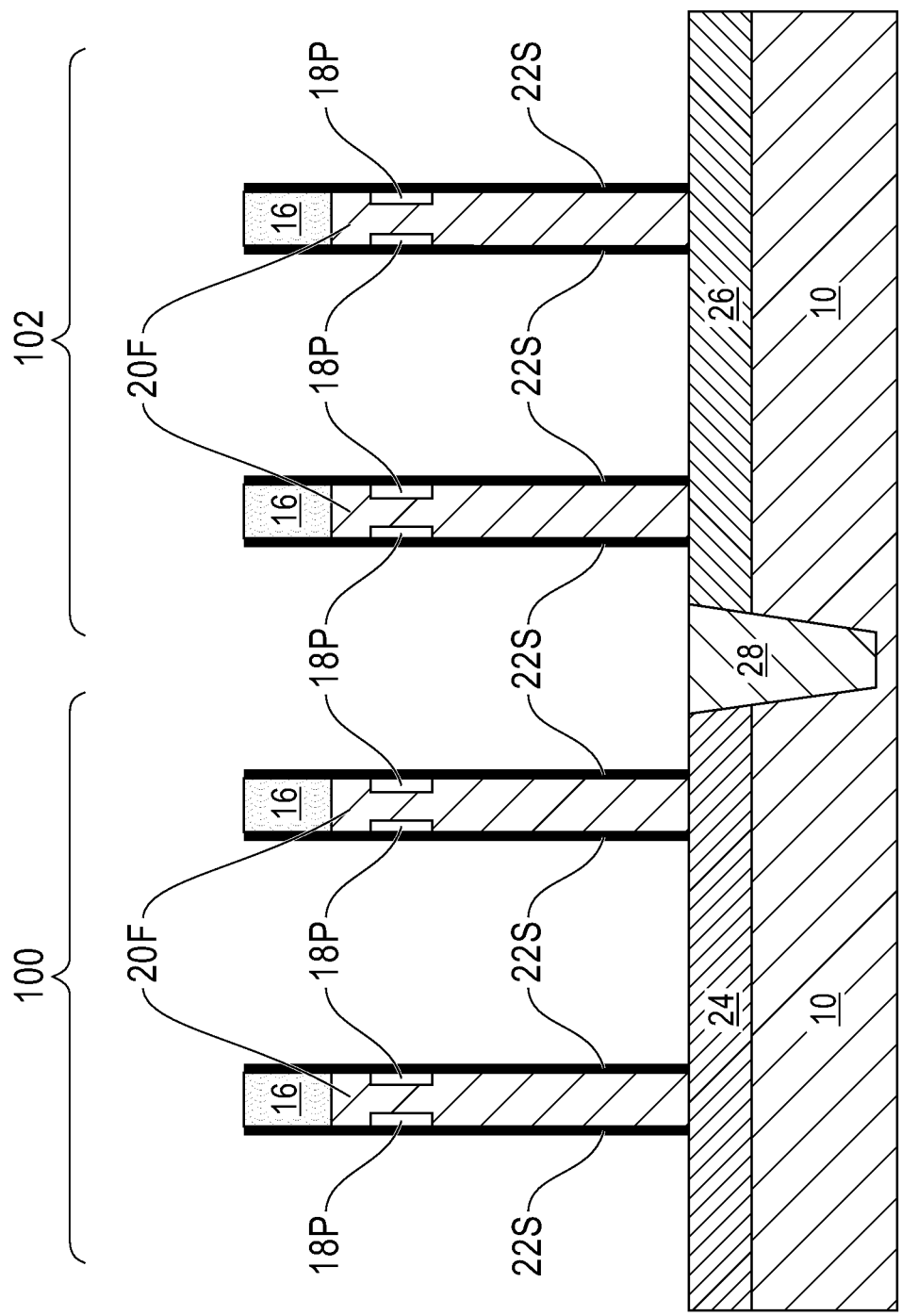
FIG. 6 is a cross sectional view of the exemplary semiconductor structure of FIG. 5 after forming a bottom nFET drain region in the nFET device region, and a bottom pFET drain region in the pFET device region, and forming an isolation structure between the different device regions.
Figure 7:
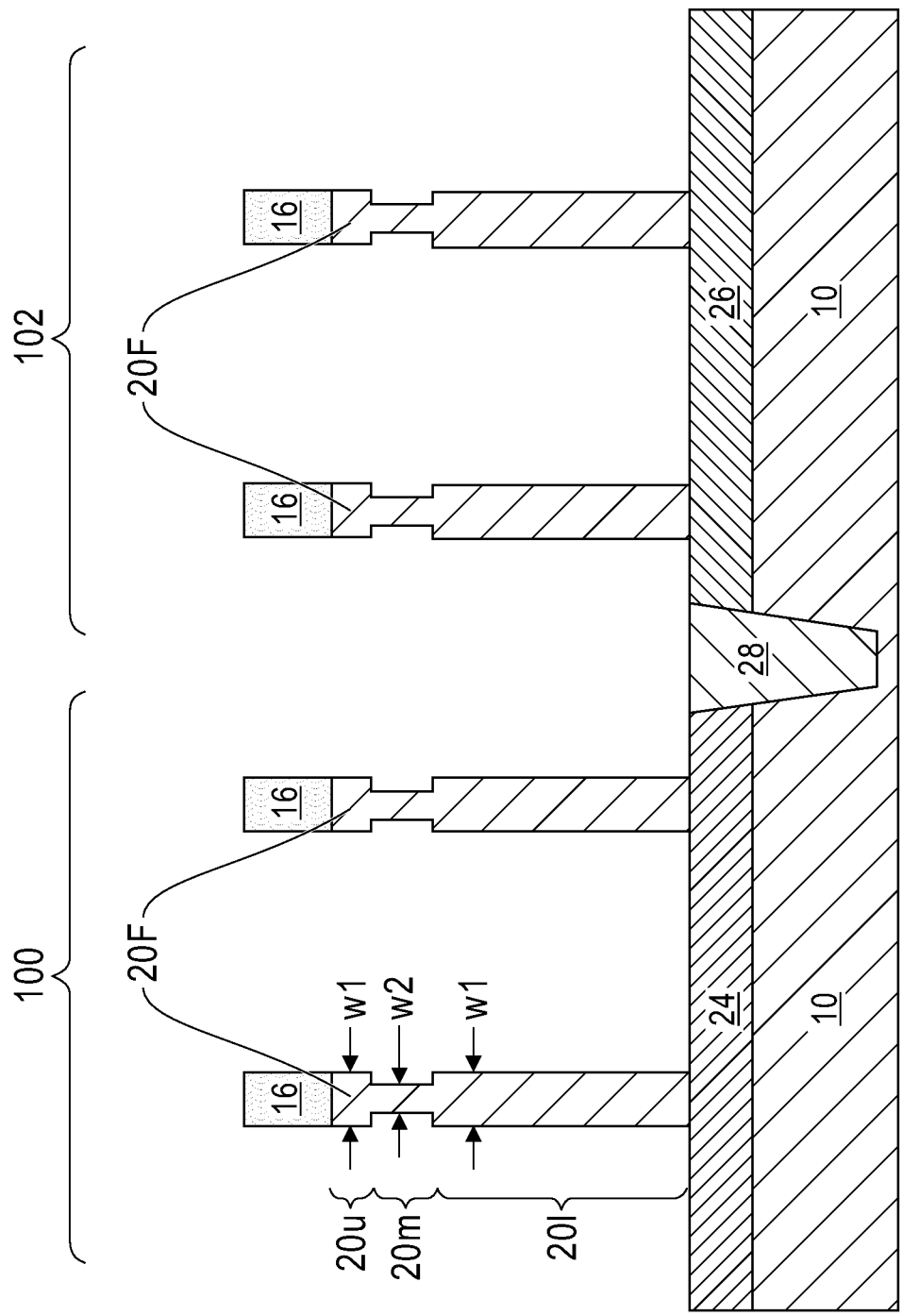
FIG. 7 is a cross sectional view of the exemplary semiconductor structure of FIG. 6 after physically exposing a sidewall of each vertical dog-bone shaped channel structure.

The germanium drive-out anneal is performed at a temperature of 900° C. or greater. In one example, the germanium drive-out anneal is performed at a temperature from 900° C. to 1150° C. The germanium drive-out anneal is performed in an inert ambient such as, for example, helium, argon, neon or nitrogen. The germanium drive-out anneal lowers the germanium content within the semiconductor material structure. At the conclusion of the germanium drive-out anneal, and as shown in FIGS. 5-7 below, a vertical dog-bone shaped channel structure 20F (fin-like or pillar-like) is provided that is composed of silicon having a lower germanium content than the first germanium content. The germanium content in the vertical dog-bone shaped channel structure 20F is 1 atomic percent or less. In one example, the germanium content in the vertical dog-bone shaped channel structure 20F is from 0.01 atomic percent to 1 atomic percent. In some examples, no germanium is present in the vertical dog-bone shaped channel structure 20F.

Each vertical dog-bone shaped channel structure 20F (see, for example, FIG. 7) has an upper portion 20u having a first channel width, w1, and a lower portion 20l having the first channel width, w1, and a middle portion 20m having a second channel width, w2, that is less than the first channel width and separating the upper portion 20u from the lower portion 20l. In one example, the first width may be from 4 nm to 12 nm, while the second width may be from 2 nm to 4 nm. In accordance with the present application, the lower portion 20u of each vertical dog-bone shaped channel structure 20F has a vertical height that is greater than the vertical height of either the middle portion 20m of each vertical dog-bone shaped channel structure 20F and the upper portion 20u of each vertical dog-bone shaped channel structure 20F.

Referring now to FIG. 5, there is illustrated the exemplary semiconductor structure of FIG. 4 after completing the drive-out anneal to provide a plurality of vertical dog-bone shaped channel structures 20F, as defined above, in each of the device regions (100, 102), and forming a spacer 22S along a sidewall of each of the vertical dog-bone shaped channel structures 20F. The formation of the spacer 22S may include removing an entirety of the first silicon dioxide layer 18L and removing an outer portion of the second silicon dioxide layer 18' while leaving a silicon dioxide plug 18P on the sidewall of the middle portion of each vertical dog-bone shaped channel structure 20F.

The removal of silicon dioxide may be performed utilizing an etch that is selective in removing silicon dioxide as compared to silicon and the hard mask material that provides each hard mask cap 16. In one example, silicon dioxide is removed utilizing hydrofluoric acid or a mixture of ammonium fluoride and hydrofluoric acid. In another example, silicon dioxide is removed in a plasma containing one of $CF_4$, $SF_6$ or $NF_3$.

The spacer 22S may be composed of dielectric spacer material such as, for example, silicon dioxide or silicon nitride, that is compositional different from the hard mask material of each hard mask cap 16. The dielectric spacer material that provides the spacer 22S may be the same as the silicon dioxide plug 18P. The spacer 22S can be formed by depositing the dielectric spacer material and then performing a spacer etch. The spacer 22S may have a width, as measured from one sidewall to another sidewall, from 1 nm to 8 nm. The spacer 22S has a topmost surface that is typically coplanar with a topmost surface of the hard mask cap 16, and a bottommost surface that is coplanar with a bottommost surface of each of the vertical dog-bone shaped channel structures 20F. The spacer 22S is located along the entirety of the vertical dog-bone shaped channel structure 20F.

Referring now to FIG. 6, there is illustrated the exemplary semiconductor structure of FIG. 5 after forming a bottom nFET drain region 24 in the nFET device region 100, and a bottom pFET drain region 26 in the pFET device region 102, and forming an isolation structure 28 between the different device regions. The bottom nFET drain region 24 may extend partially or completely beneath each vertical dog-bone shaped channel structure 20F that is present in the nFET device region 100, and the bottom pFET drain region 26 may extend partially or completely beneath each vertical dog-bone shaped channel structure 20F that is present in the pFET device region 102.

The bottom nFET drain region 24 and the bottom pFET drain region 26 can be formed in any order. In one embodiment, the bottom nFET drain region 24 and the bottom pFET drain region 26 may be formed utilizing an angled ion implantation process. In such a process, a block mask may be used to protect one device region, while processing the other device region to include the bottom drain region. The block mask is removed, and then another block mask is formed over the processed device region, while the non-processed device region is processed to include the other bottom drain region. An anneal can be used to diffuse n-type dopant beneath each vertical dog-bone shaped channel structure 20F that is present in the nFET device region 100. The anneal also diffuses p-type dopant beneath each vertical dog-bone shaped channel structure 20F that is present in the pFET device region 102.

In another embodiment, the bottom nFET drain region 24 and the bottom pFET drain region 26 may be formed by forming a trench at the footprint of each vertical dog-bone shaped channel structure 20F, and then epitaxially filling the trenches in the nFET device region 100 with an n-type doped semiconductor material, and epitaxially filling the trenches in the pFET device region 102 with a p-type doped semiconductor material. In such a process, a block mask can be used to protect one device region, while processing the other device region to include the bottom drain region. The block mask is removed, and then another block mask is formed over the processed device region, while the non-processed device region is processed to include the other bottom drain region. An anneal can then be used to diffuse n-type dopant from the n-type doped semiconductor material beneath each vertical dog-bone shaped channel structure 20F that is present in the nFET device region 100. The anneal also diffuses p-type dopant from the p-type doped semiconductor material beneath each vertical dog-bone shaped channel structure 20F that is present in the pFET device region 102.

The bottom nFET drain region 24 includes an n-type doped semiconductor material. The semiconductor material that can be used in providing the bottom nFET drain region 24 includes, but is not limited to, silicon (Si), germanium (Ge), silicon germanium alloys (SiGe), silicon carbide (SiC), silicon germanium carbide (SiGeC), III-V compound semiconductors or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements. In some embodiments, the semiconductor material that provides the bottom nFET drain region 24 is composed of silicon.

The term "n-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. The concentration of n-type dopant within the semiconductor material that provides the bottom nFET drain region 24 can range from $1 \times 10^{18}$ atoms/cm$^3$ to $1 \times 10^{21}$ atoms/cm$^3$, although dopant concentrations greater than $1 \times 10^{21}$ atoms/cm$^3$ or less than $1 \times 10^{18}$ atoms/cm$^3$ are also conceived.

The bottom pFET drain region 26 includes one of the semiconductor materials mentioned above for the bottom nFET drain region 24 and a p-type dopant. The semiconductor material that provides the bottom pFET drain region 26 may be the same as, or different from, the semiconductor material of that provides the bottom nFET device region 24. Also, the semiconductor material that provides the bottom pFET drain region 26 may be the same as, or different from, the silicon base substrate 10.

The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium and indium. The concentration of p-type dopant within the semiconductor material that provides the bottom pFET drain region 26 can range from $1 \times 10^{18}$ atoms/cm$^3$ to $1 \times 10^{21}$ atoms/cm$^3$, although dopant concentrations greater than $1 \times 10^{21}$ atoms/cm$^3$ or less than $1 \times 10^{18}$ atoms/cm$^3$ are also conceived.

In some embodiments, isolation structure 28 can be formed between the different device regions (100/102). The isolation structure 28 can be formed by forming a trench opening in an area in which sidewalls of the bottom nFET drain region 24 and bottom pFET drain region 26 are in contact with each other, and then filling the trench opening with a trench dielectric material such as, for example, silicon dioxide. A recess etch may follow the trench filling step. Although the present application describes forming the isolation structure 28 after forming the bottom nFET drain region 24 and bottom pFET drain region 26, the isolation structure 28 may be formed prior to forming the bottom nFET drain region 24 and the bottom pFET drain region 26.

Referring now to FIG. 7, there is illustrated the exemplary semiconductor structure of FIG. 6 after physically exposing a sidewall of each vertical dog-bone shaped channel structure 20F. The physically exposing step includes removing spacer 22S and removing the silicon dioxide plug 18P from each vertical dog-bone shaped channel structure 20F. The removal of the spacer 22S may be performed utilizing a first etching process that is selective in removing the dielectric spacer material that provides spacer 22S, followed by a second etching process that is selective in removing the silicon dioxide plug 18. In some embodiments, a single etch may be used to remove both the spacer 22S and the silicon dioxide plug 18P from each vertical dog-bone shaped channel structure 20F. The dog-bone shape, as defined above, of each the vertical dog-bone shaped channel structure 20F is now clearly shown.

Figure 8:
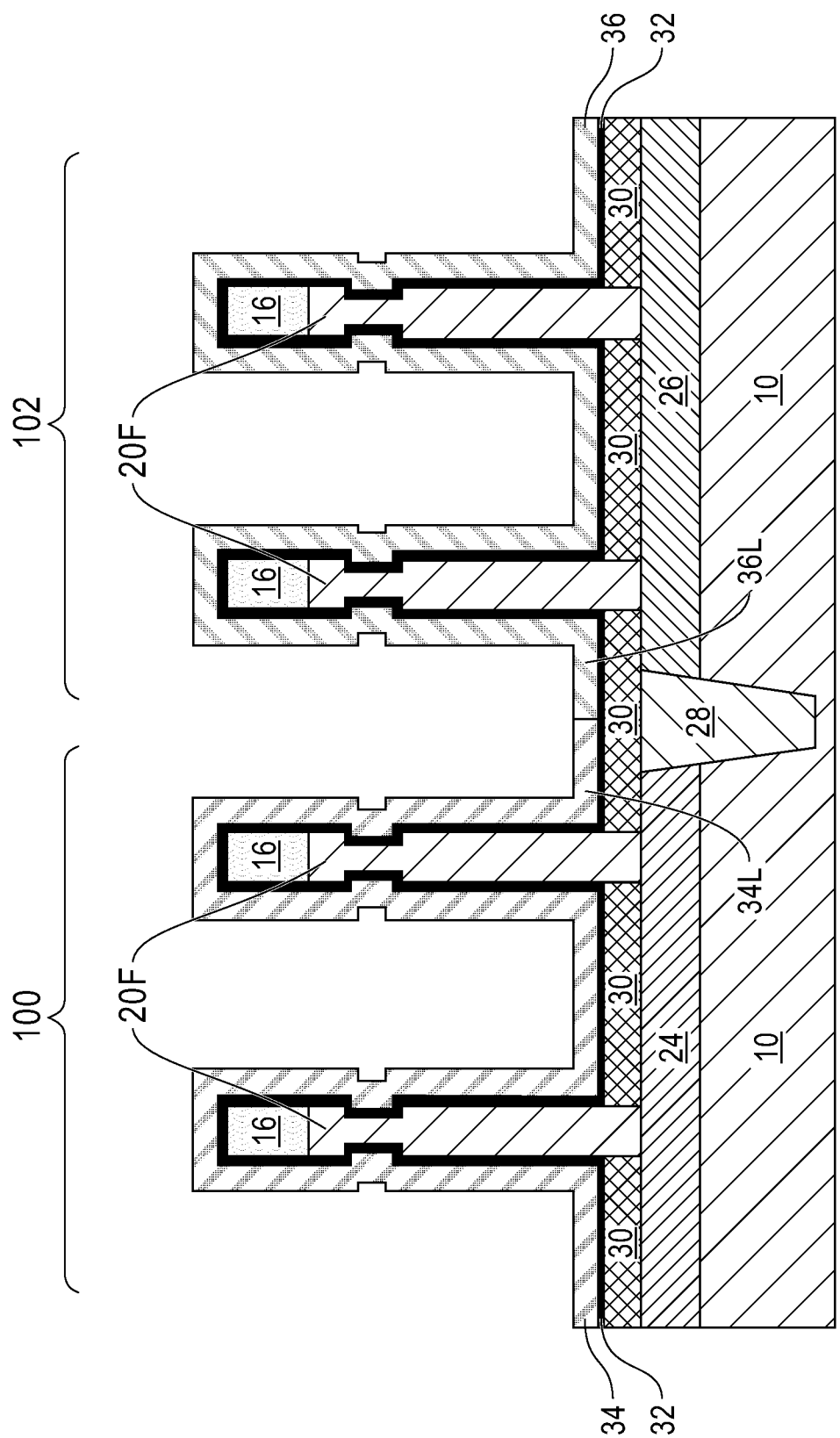
FIG. 8 is a cross sectional view of the exemplary semiconductor structure of FIG. 7 after forming a bottom spacer layer on the bottom nFET drain region and on the bottom pFET drain region, and forming a high-k gate dielectric material layer on the physically exposed sidewall of each vertical dog-bone shaped channel structure in the nFET device region and the pFET device region, and forming, in any order, an nFET work function metal layer on the high-k gate dielectric material layer that is located on each vertical dog-bone shaped channel structure in the nFET device region, and a pFET work function metal layer on the high-k gate dielectric material layer that is located on each vertical dog-bone shaped channel structure in the pFET device region.

Referring now to FIG. 8, there is illustrated the exemplary semiconductor structure of FIG. 7 after forming a bottom spacer layer 30 on the bottom nFET drain region 24 and on the bottom pFET drain region 26. In embodiments in which the isolation structure 28 is present, the bottom spacer layer 30 may also be formed on the isolation structure 28.

FIG. 8 also shows the exemplary semiconductor structure of FIG. 7 after forming a high-k gate dielectric material layer 32 on the physically exposed sidewall of each vertical dog-bone shaped channel structure 20F in the nFET device region 100 and the pFET device region 102, and forming, in any order, an nFET work function metal layer 34 on the high-k gate dielectric material layer 32 that is located on each vertical dog-bone shaped channel structure 20F in the nFET device region 100, and a pFET work function metal layer 36 on the high-k gate dielectric material layer 32 that is located on each vertical dog-bone shaped channel structure 20F in the pFET device region 102. The nFET work function metal layer 34 serves as the gate electrode in the nFET device region 100, and the pFET work function metal layer 36 serves as the gate electrode in the pFET device region 102.

The bottom spacer layer 30 contacts a sidewall surface of the lower portion 201 of the vertical dog-bone shaped channel structures 20F present in each of the device regions (100/102). The bottom spacer layer 30 may be composed of any dielectric spacer material including for example, silicon dioxide, silicon nitride or silicon oxynitride; the bottom spacer layer 30 is compositionally different from the hard mask caps 16. The bottom spacer layer 30 may be formed utilizing a deposition process such as, for example, chemical vapor deposition or plasma enhanced chemical vapor deposition. In some instances, an etch back process may follow the deposition of the dielectric spacer material that provides the bottom spacer layer 30. The bottom spacer layer 30 may have a thickness from 4 nm to 10 nm. Other thicknesses that are lesser than, or greater than, the aforementioned thickness range may also be employed in the present application as the thickness of the bottom spacer layer 30 as long as the height of the bottom spacer 30 is not greater than the height of each of the vertical dog-bone shaped channel structures 20F and there is sufficient area on each the vertical dog-bone shaped channel structures 20F to form other components of a VFET.

After forming the bottom spacer layer 30, high-k gate dielectric material layer 32 is formed. The high-k gate dielectric material layer 32 is a continuous layer that is formed laterally adjacent to a sidewall surface of each vertical dog-bone shaped channel structures 20F and each hard mask cap 16 present in the nFET and pFET device regions (100, 102), as well as on the topmost surface of each hard mask cap 16 and a topmost surface of the bottom spacer layer 30. The term "high-k gate dielectric material" denotes a gate dielectric material having a dielectric constant greater than 4.0; all dielectric constants mentioned herein are measured in a vacuum. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. The high-k gate dielectric material layer 32 can be formed by any deposition process including, for example, chemical vapor deposition (CVD), plasma enhanced chemical vapor deposition (PECVD), physical vapor deposition (PVD), sputtering, or atomic layer deposition (ALD). In one embodiment of the present application, the high-k gate dielectric material layer 32 can have a thickness in a range from 1 nm to 10 nm. Other thicknesses that are lesser than, or greater than, the aforementioned thickness range can also be employed for high-k gate dielectric material layer 32. The high-k gate dielectric material layer 32 typically has a conformal thickness. The term "conformal" denotes that a material layer has a vertical thickness along horizontal surfaces that is substantially the same (i.e., within ±5%) as the lateral thickness along vertical surfaces.

In some embodiments (not shown), an interfacial dielectric material layer may be formed prior to forming the high-k gate dielectric material layer 32. When present, the interfacial dielectric material layer is composed of silicon dioxides. The interfacial dielectric material layer can be formed utilizing a thermal oxidation (i.e., growth) process. The interfacial dielectric material layer may have a thickness from 0.5 nm to 2.0 nm.

After forming the high-k gate dielectric material layer 32, the nFET work function metal layer 34 is formed on the high-k gate dielectric material layer 32 that is located on each vertical dog-bone shaped channel structure 20F in the nFET device region 100, and the pFET work function metal layer 36 is formed on the high-k gate dielectric material layer 32 that is located on each vertical dog-bone shaped channel structure 20F in the pFET device region 102.

The order of the formation of nFET work function metal layer 34 and the pFET work function metal layer 36 may vary. In one embodiment, the nFET work function metal layer 34 is formed prior to the pFET work function metal layer 36. In another embodiment, the pFET work function metal layer 36 is formed prior to the nFET work function metal layer 34. In either embodiment, a continuous layer of one of the work function metal layers is formed in both device regions. A block mask is then formed over the work function metal layer that is present in the appropriate device region, and then an etch is used to remove the work function metal layer from the inappropriate device region. Another work function metal layer of the appropriate type is then formed in the device area not including the previously formed work function metal layer.

The nFET work function metal layer 34 effectuates an n-type threshold voltage shift; i.e., an n-type work function is used. "N-type threshold voltage shift" as used herein means a shift in the Fermi energy of an n-type semiconductor device towards a conduction band of silicon in a silicon-containing material of the n-type semiconductor device. The "conduction band" is the lowest lying electron energy band of the doped material that is not completely filled with electrons. In one embodiment, the work function of the n-type work function metal ranges from 4.1 eV to 4.3 eV. In one embodiment, the n-type work function metal layer 34 is composed of at least one of titanium aluminum, titanium aluminum carbide, tantalum nitride, titanium nitride, hafnium nitride, hafnium silicon, or combinations and thereof. The n-type work function metal layer 34 may be a single material layer or a multi-material layer.

The pFET work function metal layer 36 effectuates a p-type threshold voltage shift, i.e., a p-type work function metal is employed. In one embodiment, the work function of the p-type work function metal ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the Fermi energy of a p-type semiconductor device towards a valence band of silicon in the silicon containing material of the p-type semiconductor device. A "valence band" is the highest range of electron energies where electrons are normally present at absolute zero.

In one embodiment, the pFET work function metal layer 36 may be composed of titanium and its nitride or carbide. In one specific embodiment, the p-type work function metal is composed of titanium nitride. The pFET work function metal layer 36 may also be composed of titanium aluminum nitride, tantalum nitride, ruthenium, platinum, molybdenum, cobalt, and alloys and combinations or thereof. The p-type work function metal layer 36 may be a single material layer or a multi-material layer.

The work function metal layers (34, 36) may be formed utilizing a deposition process such as, for example, chemical vapor deposition (CVD), plasma enhanced chemical vapor deposition (PECVD), physical vapor deposition (PVD), sputtering, or atomic layer deposition (ALD). In one embodiment of the present application, the work function metal layers (34, 36) can have a thickness in a range from 1 nm to 10 nm. Other thicknesses that are lesser than, or greater than, the aforementioned thickness range can also be employed for each of work function metal layers (34, 36). In some embodiments, the nFET work function metal layer 34 and the pFET work function metal layer 36 both have a conformal thickness.

Figure 9:
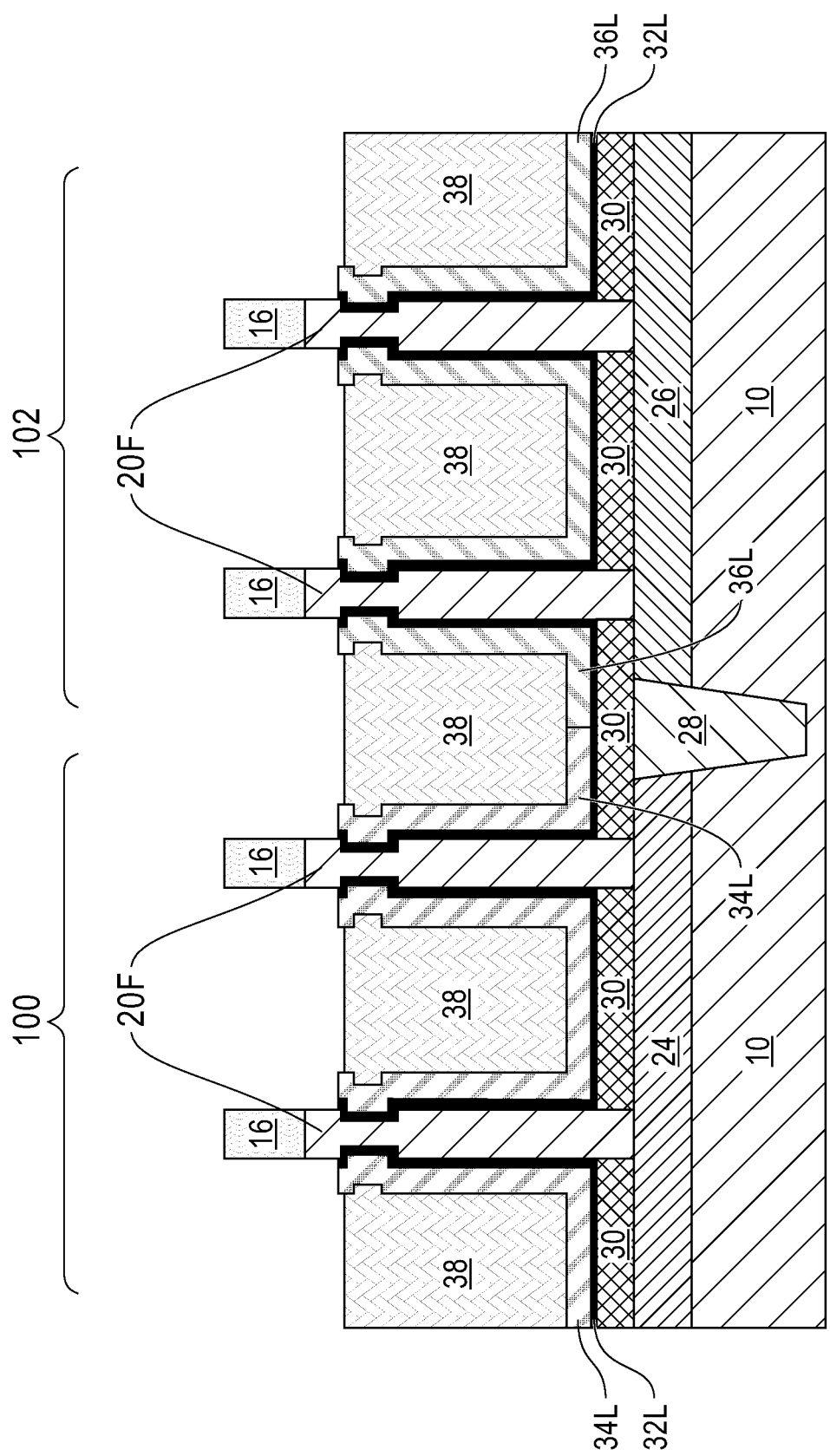
FIG. 9 is a cross sectional view of the exemplary semiconductor structure of FIG. 8 after forming a recessed sacrificial material layer, and physically exposing a sidewall of an upper portion of each vertical dog-bone shaped channel structure in both the nFET device region and the pFET device region.

Referring now to FIG. 9, there is illustrated the exemplary semiconductor structure of FIG. 8 after forming a recessed sacrificial material layer 38, and physically exposing a sidewall of an upper portion 20u of each vertical dog-bone shaped channel structure 20F both the nFET device region 100 and the pFET device region 102.

The forming of the recessed sacrificial material layer 38 includes deposition of a sacrificial material and performing a recess etch. The sacrificial material may include an organic planarization material or a photoresist material. The deposition of the sacrificial material may include any deposition process such as, for example, chemical vapor deposition, plasma enhanced chemical vapor deposition or spin-on coating. The recess etch may be performed utilizing an etchant that is selective in removing a portion of the deposited sacrificial material. The recessed sacrificial material layer 38 has a topmost surface that is below a topmost surface of the upper portion 20u of each vertical dog-bone shaped channel structure 20F.

After providing the recessed sacrificial material layer 38, the physically exposed portion of the work function metal layers (34, 36) and an underlying portion of the high-k gate dielectric material layer 32 are removed utilizing the recessed sacrificial material layer 38 as an etch mask. A single etchant process or multiple etching processes can be used to remove the physically exposed portion of the work function metal layers (34, 36) and the underlying portion high-k gate dielectric material layer 32.

As is shown, a portion of the nFET work function metal layer 34 and a portion of the high-k gate dielectric layer 32 remain laterally surrounding each vertical dog-bone shaped channel structure 20F in the nFET device region 100, and a portion of the pFET work function metal layer 36 and another portion of the high-k gate dielectric layer 32 remain laterally surrounding each vertical dog-bone shaped channel structure 20F in the pFET device region 102. The remaining portion of the nFET work function metal layer 34 can be referred to herein as an nFET work function metal liner 34L, the remaining portion of the pFET work function metal layer 36 can be referred to herein as a pFET work function metal liner 36L, and each remaining portion of the high-k gate dielectric material layer 32 may be referred to a high-k gate dielectric material liner 32L.

Collectively, the nFET work function metal liner 34L and the high-k gate dielectric material liner 32L in the nFET device region 100 provide an nFET gate structure, while collectively the pFET work function metal liner 36L and the high-k gate dielectric material liner 32L in the pFET device region 102 provide a pFET gate structure. As is shown, a topmost surface of the nFET gate structure (32L, 34L) is coplanar with a topmost surface of the pFET gate structure (32L, 36L) as well as a topmost surface of the recessed sacrificial material layer 38.

Figure 10:
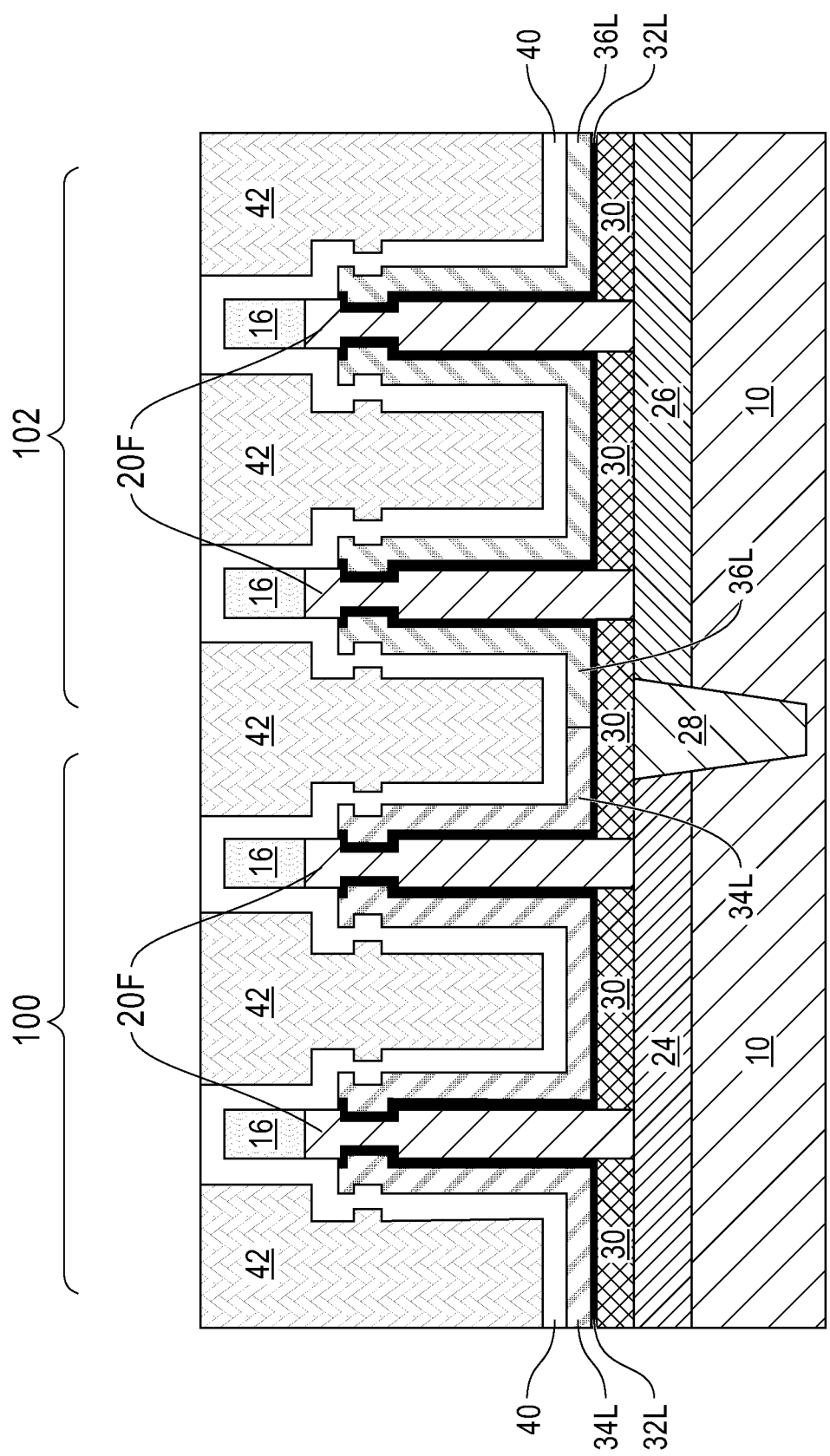
FIG. 10 is a cross sectional view of the exemplary semiconductor structure of FIG. 9 after removing the recessed sacrificial material layer, and forming a gate encapsulation layer and a middle-of-the-line (MOL) dielectric material layer.

Referring now to FIG. 10, there is illustrated the exemplary semiconductor structure of FIG. 9 after removing the recessed sacrificial material layer 38, and forming a gate encapsulation layer 40 and a middle-of-the-line (MOL) dielectric material layer 42. The gate encapsulation layer 40 has a topmost surface that is coplanar with a topmost surface of the MOL dielectric material layer 42.

The removal of the recessed sacrificial material layer 38 can be performed utilizing an etching process that is selective in removing the sacrificial material that provides the recessed sacrificial material layer 38. The removal of the sacrificial material layer 38 physically exposes the nFET gate structure (32L, 24L) and the pFET gate structure (32L, 36L) in each of the respective device regions (100, 102).

The gate encapsulation layer 40 is a continuous layer that is present in both device regions (100, 102). The topmost surface of the gate encapsulation layer 40 is located above each hard mask cap 16. The gate encapsulation layer 40 is composed of a dielectric material that is capable of preventing air and/or moisture to egress into the nFET gate structure (32L, 34L) and the pFET gate structure (32L, 36L) in each of the respective device regions (100, 102). In one example, the gate encapsulation layer 40 is composed of silicon nitride. The gate encapsulation layer 40 can be formed utilizing a deposition process such as, for example, chemical vapor deposition (CVD), plasma enhanced chemical vapor deposition (PECVD), physical vapor deposition (PVD), sputtering, or atomic layer deposition (ALD). In one embodiment of the present application, the dielectric material that provides the gate encapsulation layer 40 can have a thickness in a range from 1 nm to 10 nm. Other thicknesses that are lesser than, or greater than, the aforementioned thickness range can also be employed for the gate encapsulation layer 40. In some embodiments, the gate encapsulation layer 40 has a conformal thickness.

The MOL dielectric material layer 42 is composed of a dielectric material that is compositionally different from the gate encapsulation layer 40. The MOL dielectric material layer 42 may be composed of silicon dioxide, undoped silicate glass (USG), fluorosilicate glass (FSG), borophosphosilicate glass (BPSG), a spin-on low k dielectric layer, a chemical vapor deposition (CVD) low-k dielectric layer or any combination thereof. In another embodiment, a self-planarizing material such as a spin-on glass (SOG) or a spin-on low-k dielectric material such as SiLK™ can be used as the MOL dielectric material layer 42; the term "low-k" denotes a dielectric material having a dielectric constant of less than 4.0. In one embodiment, MOL dielectric material layer 42 can be formed utilizing a deposition process including, for example, chemical vapor deposition (CVD), plasma enhanced chemical vapor deposition (PECVD), evaporation or spin-on coating. Following deposition of the MOL dielectric material layer 42, a planarization process such as, for example, chemical mechanical polishing (CMP), can employed.

Figure 11:
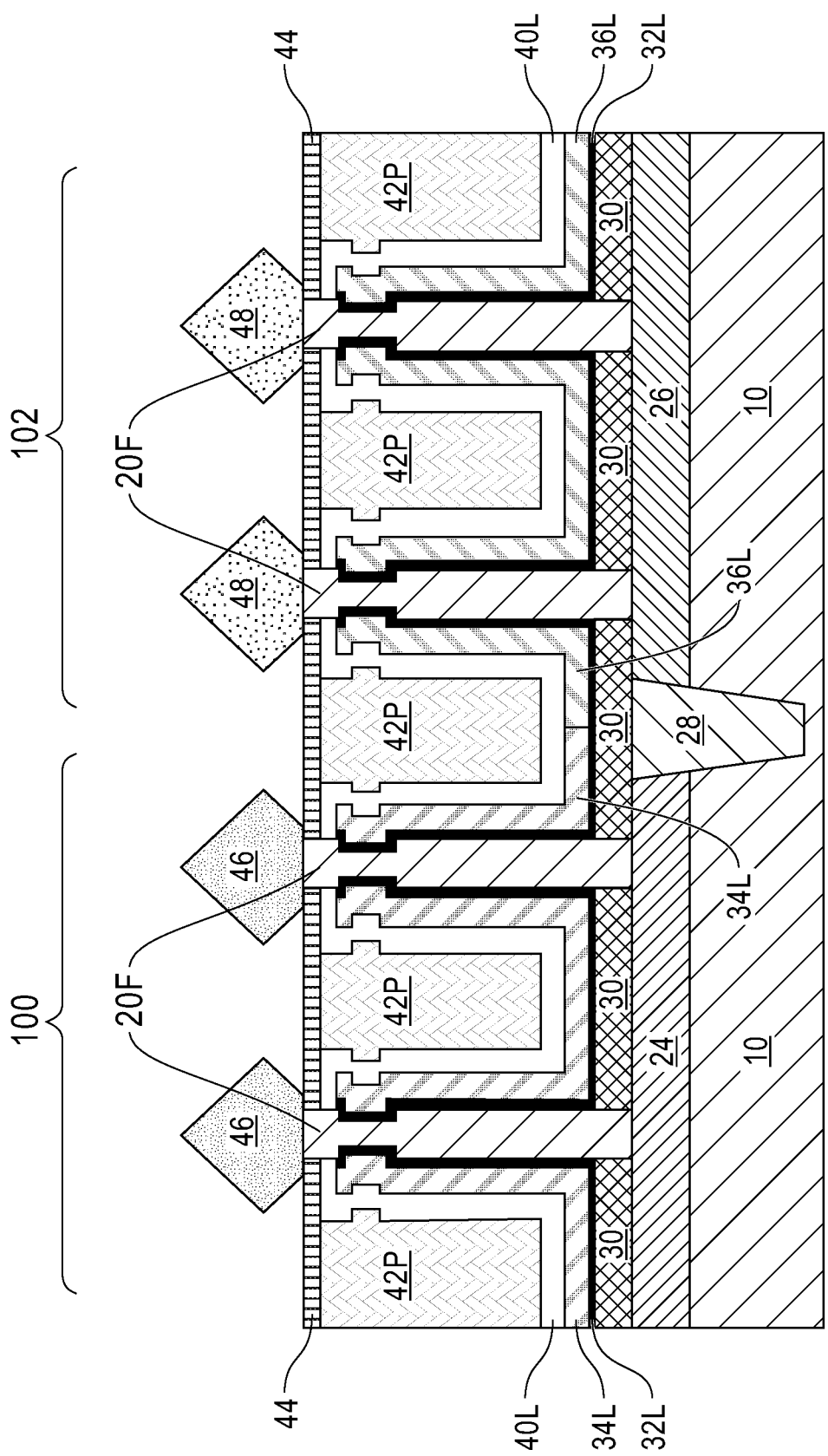
FIG. 11 is a cross sectional view of the exemplary semiconductor structure of FIG. 10 after physically exposing a topmost surface and a portion of the sidewall of the upper portion of each vertical dog-bone shaped channel structure, forming a top spacer layer contacting the physically exposed portion of the sidewall of the upper portion of each vertical dog-bone shaped channel structure, and forming, in any order, a top nFET source region on the physically exposed topmost surface of each vertical dog-bone shaped channel structure in the nFET device region, and a top pFET source region on the physically exposed topmost surface of each vertical dog-bone shaped channel structure in the pFET device region.

Referring now to FIG. 11, there is illustrated the exemplary semiconductor structure of FIG. 10 after physically exposing a topmost surface and a portion of the sidewall of the upper portion 20u of each vertical dog-bone shaped channel structure 20F in both device regions (100, 102), forming a top spacer layer 44 contacting the physically exposed portion of the sidewall of the upper portion 20u of each vertical dog-bone shaped channel structure 20F, and forming, in any order, a top nFET source region 46 on the physically exposed topmost surface of each vertical dog-bone shaped channel structure 20F in the nFET device region 100, and a top pFET source region 48 on the physically exposed topmost surface of each vertical dog-bone shaped channel structure 20F in the pFET device region 102.

The physically exposing the topmost surface and a portion of the sidewall of the upper portion 20u of each vertical dog-bone shaped channel structure 20F in both device regions (100, 202) includes one or more material removal processes that remove an upper portion of the MOL dielectric material layer 42, and upper portion of the gate encapsulation layer 40, and each hard mask cap 16. The MOL dielectric material layer 42 that remains after this step may be referred to a MOL dielectric material 42P, and the gate encapsulation layer 40 that remains after this step may be referred to a gate encapsulation liner 40L. The MOL dielectric material 42P has a topmost surface that is coplanar with a topmost surface of the gate encapsulation liner 40L; the gate encapsulation liner 40L in the nFET device region 100 covers the entirety of the nFET gate structure (32L, 34L) and the gate encapsulation liner 40L in the pFET device region 102 covers the entirety of the pFET gate structure (32L, 36L).

The top spacer layer 44 may be composed of any dielectric spacer material including for example, silicon dioxide, silicon nitride or silicon oxynitride. The top spacer layer 44 may be composed of a same, or different, dielectric spacer material than the bottom spacer layer 30. The top spacer layer 44 may be formed utilizing a deposition process such as, for example, chemical vapor deposition or plasma enhanced chemical vapor deposition. In some instances, an etch may follow the deposition of the dielectric spacer material that provides the top spacer layer 44. The top spacer layer 44 may have a thickness from 4 nm to 10 nm. Other thicknesses that are lesser than, or greater than, the aforementioned thickness range may also be employed in the present application as the thickness of the top spacer layer 44.

The top nFET source region 46 and the top pFET source region 48 can be formed utilizing an epitaxial growth (or deposition) process, as defined above, and in any order. For example, and in one embodiment, the top nFET source region 46 can be formed prior to the top pFET source region 48. In such an embodiment, a block mask is formed in the pFET device region 102 and then the top nFET source region 46 is formed by epitaxial growth. Following the epitaxial growth of the top nFET source region 46, the block mask is removed from the pFET device region 102, another block mask is formed in the nFET device region 100 that now includes the top nFET source region 46, and thereafter the top pFET source region 48 is formed by epitaxial growth. Following epitaxial growth of the top pFET source region 48, the another block mask is removed from the nFET device region 100. In embodiments, in which the top pFET source region 48 is formed prior to the top nFET source region 46, the order of the above mentioned processing steps is reversed.

The top nFET source region 46 includes a semiconductor material (as defined above) and an n-type dopant (as also defined above). The semiconductor material that provides the top nFET source region 46 may be the same or different from the semiconductor material that provides the bottom nFET drain region 24. The concentration of n-type dopant within the semiconductor material that provides the top nFET source region 46 can range from $1\times10^{18}$ atoms/cm$^3$ to $1\times10^{21}$ atoms/cm$^3$, although dopant concentrations greater than $1\times10^{21}$ atoms/cm$^3$ or less than $1\times10^{8}$ atoms/cm$^3$ are also conceived. The top nFET source region 46 may be grown a topmost surface of each vertical dog-bone shaped channel structure 20F in the nFET device region 100; a portion of the top nFET source region 46 may form on a physically exposed sidewall of the upper portion 20u of the vertical dog-bone shaped channel structures 20F in the nFET device region 100. The top nFET source region 46 may have a faceted surface. In one example, the top nFET source region 46 may be diamond shaped.

The top pFET source region 48 includes a semiconductor material (as defined above) and a p-type dopant (as also defined above). The semiconductor material that provides the top pFET source region 48 may be the same or different from the semiconductor material that provides the bottom pFET drain region 26. The concentration of p-type dopant within the semiconductor material that provides the top pFET source region 48 can range from $1\times10^{18}$ atoms/cm$^3$ to $1\times10^{21}$ atoms/cm$^3$, although dopant concentrations greater than $1\times10^{21}$ atoms/cm$^3$ or less than $1\times10^{18}$ atoms/cm$^3$ are also conceived. The top pFET source region 48 may be grown on a topmost surface of each vertical dog-bone shaped channel structure 20F in the pFET device region 102; a portion of the top pFET source region 48 may form on a physically exposed sidewall of the upper portion 20u of the vertical dog-bone shaped channel structures 20F in the pFET device region 102. The top pFET source region 48 may have a faceted surface. In one example, the top pFET source region 48 may be diamond shaped.

FIG. 11 illustrates a semiconductor structure in accordance with the present application that includes a vertical n-type field effect transistor (nFET) and a laterally adjacent p-type field effect transistor (pFET). The vertical nFET comprises includes at least one vertical dog-bone shaped channel structure 20F present in an nFET device region 100 and extending upwards from a silicon base substrate 10. The at least one vertical dog-bone shaped channel structure 20F present in the nFET device region 100 is composed of silicon having a germanium content that is 1 atomic percent or less and having a lower portion 201 having a first channel width, w1, a middle portion 20m having a second channel width, w2, that is less than the first channel width, w1, and an upper portion 20u having the first channel width, w1. A bottom nFET drain region 24 is located beneath the lower portion 201 of the at least one vertical dog-bone shaped channel structure 20F present in the nFET device region 100. An nFET gate structure (32L, 34L) is located laterally adjacent to the at least one vertical dog-bone shaped channel structure 20F present in the nFET device region 100. A top nFET source region 46 is located on a topmost surface of the upper portion 20u of the at least one vertical dog-bone shaped channel structure 20F in the nFET device region 100. In accordance with the present application, the middle portion 20m of the at least one vertical dog-bone shaped channel structure 20F in the nFET device region 100 is in closer proximity to the top nFET source region 46 than the bottom nFET drain region 24.

The vertical pFET includes at least one vertical dog-bone shaped channel structure 20F present in a pFET device region 102 and extending upwards from the silicon base substrate 10. The at least one vertical dog-bone shaped channel structure 20F present in the pFET device region 102 is composed of silicon having a germanium content that is 1 atomic percent or less and having a lower portion 201 having a first channel width, w1, a middle portion 20m having a second channel width, w2, that is less than the first channel width, w1, and an upper portion 20u having the first channel width, w1. A bottom pFET drain region 26 is located beneath the lower portion of the at least one vertical dog-bone shaped channel structure 20F present in the pFET device region 102. A pFET gate structure (32L, 36L) is located laterally adjacent to the at least one vertical dog-bone shaped channel structure 20F present in the pFET device region 102, A top pFET source region 48 is located on a topmost surface of the upper portion 20u of the at least one vertical dog-bone shaped channel structure 20F in the pFET device region 102. In accordance with the present application, the middle portion 20m of the at least one vertical dog-bone shaped channel structure 20F in the pFET device region 102 is in closer proximity to the top pFET source region 48 than the bottom pFET drain region 26.

Due to the quantum confinement effect, the middle portion 20m of the at least one vertical dog-bone shaped channel structure 20F that is present in both the nFET device region 100 and the pFET device region 102 has a higher threshold voltage than the lower portion 201 and the upper portion 20u of the at least one vertical dog-bone shaped channel structure 20F. Hence, the at least one vertical dog-bone shaped channel structure 20F present in both the nFET device region 100 and the pFET device region 102 has an asymmetric threshold voltage profile.

Figure 12:
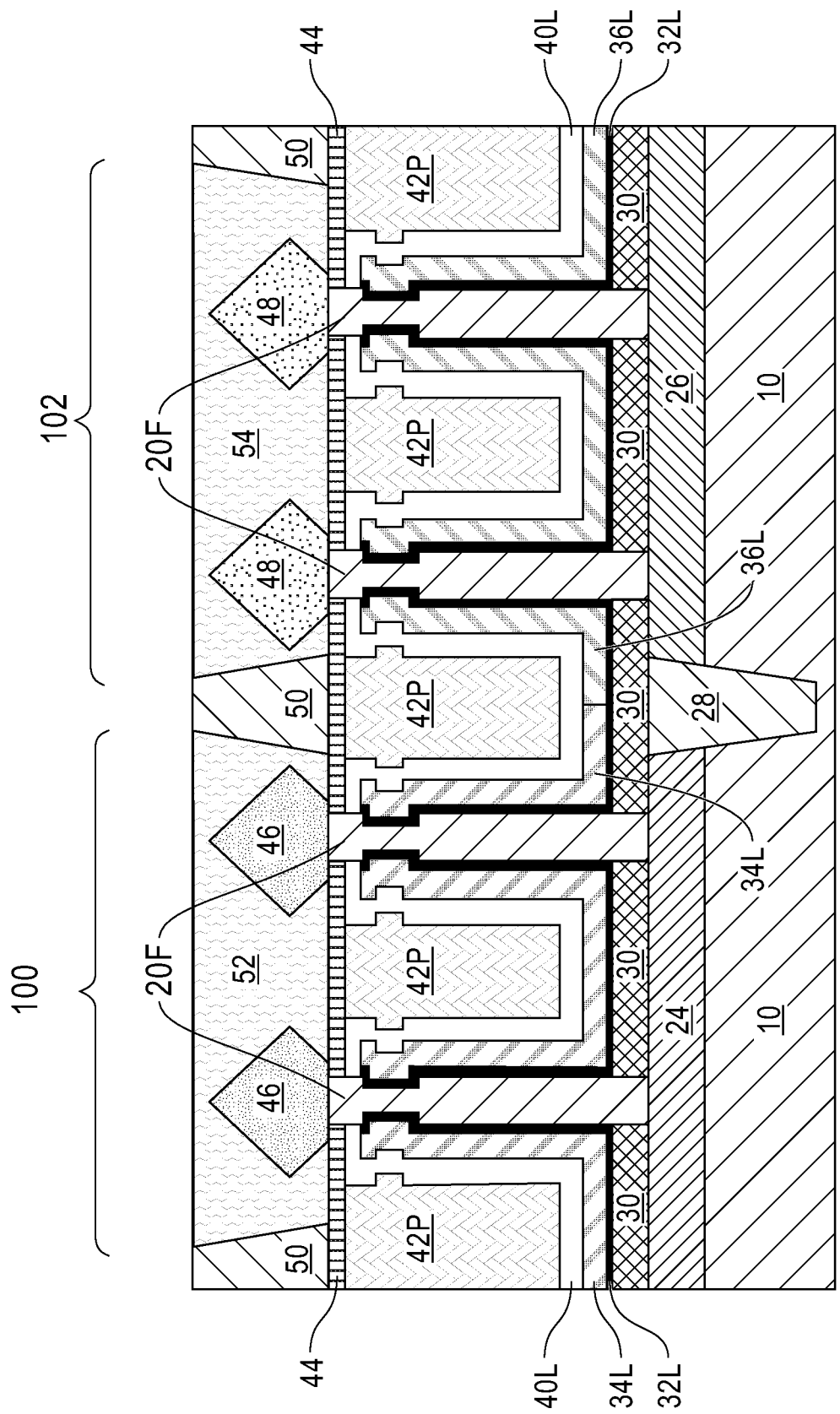
FIG. 12 is a cross sectional view of the exemplary semiconductor structure of FIG. 11 after forming an interlayer dielectric (ILD) material layer having contact structures embedded therein.

Referring now to FIG. 12, there is illustrated the exemplary semiconductor structure of FIG. 11 after forming an interlayer dielectric (ILD) material layer 50 having contact structures 52, 54 embedded therein. The ILD material 50 may include one of the dielectric materials mentioned above for the MOL dielectric material layer 42. The ILD material layer 50 may include a same, or different dielectric material, than the MOL dielectric material layer 42. The ILD material layer 50 may be formed by one of the deposition processes mentioned above in forming the MOL dielectric material layer 42. A planarization process may follow the deposition of the dielectric material that provides the ILD material layer 50.

Contact openings (not specifically shown) are then formed into the ILD material layer 50 to physically exposed surfaces of the top nFET source region 46 and the top pFET source region 48. A contact metal such as, for example, copper, aluminum, tungsten, cobalt, or alloys thereof is the formed into each contact opening utilizing a deposition process. A planarization process may follow the deposition process. The contact metal or metal alloy within each contact opening is referred to herein as a contact structure 52, 54. Contact structures 52, (i.e., first contact structures) contact the top nFET source region 46, while contact structures (i.e., second contact structures) contact the top pFET source region 48. As shown in FIG. 12, the contact structures 52, 54 have a topmost surface that is coplanar with a topmost surface of the ILD material layer 50.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
   at least one vertical dog-bone shaped channel structure present in a device region and extending upwards from a silicon base substrate, wherein the at least one vertical dog-bone shaped channel structure is composed of silicon having a germanium content that is 1 atomic percent or less and having a lower portion having a first channel width, a middle portion having a second channel width that is less than the first channel width, and an upper portion having the first channel width;
   a bottom drain region located beneath the lower portion of the at least one vertical dog-bone shaped channel structure;
   a top source region located on a topmost surface of the upper portion of the at least one vertical dog-bone shaped channel structure, wherein the middle portion of the at least one vertical dog-bone shaped channel structure is in closer proximity to the top source region than the bottom drain region; and
   a gate structure located laterally adjacent to the at least one vertical dog-bone shaped channel structure.

2. The semiconductor structure of claim 1, wherein the at least one vertical dog-bone shaped channel structure has an asymmetric threshold voltage profile in which the middle portion of the at least one vertical dog-bone shaped channel structure has a higher threshold voltage than the lower portion and the upper portion of the at least one vertical dog-bone shaped channel structure.

3. The semiconductor structure of claim 1, wherein the device region is an nFET device region, and the gate structure is an nFET gate structure comprising a high-k gate dielectric material liner and an nFET work function metal liner.

4. The semiconductor structure of claim 1, wherein the device region is a pFET device region, and the gate structure is a pFET gate structure comprising a high-k gate dielectric material liner and a pFET work function metal liner.

5. The semiconductor structure of claim 1, further comprising a bottom spacer located on the bottom drain region and contacting a sidewall of the lower portion of the at least one vertical dog-bone shaped channel structure.

6. The semiconductor structure of claim 5, further comprising a top spacer located above the gate structure and contacting a sidewall on the upper portion of the at least one vertical dog-bone shaped channel structure.

7. The semiconductor structure of claim 1, further comprising a gate encapsulation liner located on a sidewall and a topmost surface of the gate structure, and a middle-of-the-line (MOL) dielectric material located adjacent to the gate encapsulation layer, wherein the MOL dielectric material has a topmost surface that is coplanar with a topmost surface of the gate encapsulation layer.

8. The semiconductor structure of claim 1, further comprising a contact structure contacting the top source region and embedded in an interlayer dielectric material layer.

* * * * *